(12) United States Patent
Brase et al.

(10) Patent No.: US 6,841,481 B2
(45) Date of Patent: Jan. 11, 2005

(54) ETCHING PROCESS FOR A TWO-LAYER METALLIZATION

(75) Inventors: Gabriela Brase, Fishkill, NY (US); Gregoire Grandremy, Dresden (DE)

(73) Assignee: Infineon Technologies AG, Munich (DE)

( * ) Notice: Subject to any disclaimer, the term of this patent is extended or adjusted under 35 U.S.C. 154(b) by 112 days.

(21) Appl. No.: 10/073,550

(22) Filed: Feb. 11, 2002

(65) Prior Publication Data

US 2002/0146906 A1 Oct. 10, 2002

Related U.S. Application Data

(63) Continuation of application No. PCT/EP00/07784, filed on Aug. 10, 2000.

(30) Foreign Application Priority Data

Aug. 11, 1999 (DE) .......................................... 199 37 994

(51) Int. Cl.[7] ..................... H01L 21/311; H01L 21/302
(52) U.S. Cl. ..................... 438/700; 438/706; 438/714; 438/723; 438/724; 438/725
(58) Field of Search .............................. 438/700, 706, 438/714, 723, 724, 725

(56) References Cited

U.S. PATENT DOCUMENTS

| 5,612,254 A | 3/1997 | Mu et al. .............. 437/195 |
|---|---|---|
| 5,635,423 A | 6/1997 | Huang et al. ............... 437/195 |
| 5,702,982 A | 12/1997 | Lee et al. .................. 437/195 |
| 5,726,100 A | 3/1998 | Givens ........................ 438/702 |
| 5,773,199 A | 6/1998 | Linliu et al. ................ 430/316 |
| 5,801,094 A | 9/1998 | Yew et al. .................. 438/624 |
| 5,854,140 A | 12/1998 | Jaso et al. .................. 438/740 |
| 5,874,201 A | 2/1999 | Licata et al. ................ 430/314 |
| 5,883,006 A * | 3/1999 | Iba ............................. 438/712 |
| 6,117,786 A * | 9/2000 | Khajehnouri et al. ....... 438/700 |
| 6,294,459 B1 * | 9/2001 | Yin et al. .................... 438/636 |
| 6,358,849 B1 * | 3/2002 | Havemann et al. ......... 438/689 |
| 2001/0008226 A1 * | 7/2001 | Hung et al. .................. 216/18 |

FOREIGN PATENT DOCUMENTS

| EP | 0 834 916 A2 | 4/1998 |
|---|---|---|
| EP | 0 859 400 A2 | 8/1998 |
| JP | 09 134 862 A | 5/1997 |

* cited by examiner

Primary Examiner—Duy-Vu Deo
(74) Attorney, Agent, or Firm—Laurence A. Greenberg; Werner H. Stemer; Ralph E. Locher

(57) ABSTRACT

The novel etching process for a two-layer metallization, or dual damascene patterning, is simple and cost-effective to carry out and reliably prevents fences from forming during the etching process in the region of the polymer intermediate layer. The etching of the oxide layer and of the polymer intermediate layer for the dual damascene patterning is effected by a $CF_4$ ARC open process with high selectivity with respect to the photoresist with a lengthened etching time.

12 Claims, 1 Drawing Sheet

US 6,841,481 B2

ETCHING PROCESS FOR A TWO-LAYER METALLIZATION

CROSS-REFERENCE TO RELATED APPLICATION

This application is a continuation of copending International Application No. PCT/EP00/07784, filed Aug. 10, 2000, which designated the United States.

BACKGROUND OF THE INVENTION

Field of the Invention

The invention lies in the semiconductor processing field. More specifically, the invention relates to an etching process for a two-layer metallization or dual damascene patterning for a semiconductor structure having functional elements formed in a substrate, a dielectric situated on the substrate, for example an oxide layer, and the etching mask comprising a photoresist and a polymer intermediate layer being inserted between the etching mask and the oxide layer.

Semiconductor structures are generally equipped with a multilevel metallization with corresponding interconnects which are connected via vertical intermediate connections to one another and/or to active or doped elements of the semiconductor structure. The interconnects and the intermediate connections are fabricated in a plurality of process steps which comprise deposition, patterning and etching steps.

A customary method for fabricating a two-level metallization consists firstly in fabricating a connection to individual functional elements of the semiconductor structure. To that end, with the aid of a photolithographic process followed by an etching step, an opening is produced through the oxide layer situated on the semiconductor structure, thereby defining the position of the intermediate connection in the first metallization plane. This opening, which extends vertically through the semiconductor structure, is subsequently filled with a thin adhesion layer, e.g. titanium nitride, and a metal, e.g. tungsten, in a deposition process, e.g. a CVD or sputtering method. Since the deposition process cannot be limited just to the opening, rather deposition is effected on the entire surface of the semiconductor structure, the excess metal on the surface must be removed for example by means of a so-called CMP process (chemical mechanical polishing) or by etching-back. Afterward, a metallization, e.g. made of aluminum, is applied on the oxide layer present and is then patterned photolithographically in order to produce the desired interconnect structure. That is done by applying a photoresist from which a photoresist etching mask is formed photolithographically, so that etching can then be effected through the etching mask and, finally, the interconnects remain.

In a preferred variant, an oxide layer is applied over the whole area in a planar manner and the negative of the interconnects is produced in the oxide layer by firstly applying a photoresist on the latter, which photoresist is then patterned photolithographically. Afterward, the negative structure of the interconnects is etched into the oxide layer through the openings in the photoresist. In a further step, the negative structure is then filled with a liner and then with a metal, e.g. aluminum or copper. The excess metal is then likewise removed by means of a CMP process step.

U.S. Pat. No. 5,801,094, by way of example, describes a dual damascene method wherein the metallization of the intermediate connections between structural elements of the semiconductor structure and an interconnect plane and the metallization of the interconnects of the interconnect plane are effected in one step. However, the preparatory method steps are still complicated. Thus, firstly an oxide layer as dielectric is applied on the substrate and then an etching stop layer is applied. Openings are etched into the etching stop layer at the locations at which intermediate connections are to be realized, after the photolithographic application of an etching mask, with the result that the underlying oxide layer is uncovered. A further oxide layer as carrier for the interconnects of a metallization plane is then applied on the etching stop layer. The patterning of the negative form of the interconnects within the upper oxide layer and of the negative form for the intermediate connections is effected with the aid of photolithography and subsequent etching. During the etching operation, openings are etched into the upper oxide layer in accordance with the etching mask either until the etching stop layer is reached or, at the locations where the etching stop layer is interrupted for the realization of the intermediate connections in the via, as far as the underlying interconnects to be contact-connected or as far as the substrate (self-aligned dual damascene).

After the removal of the etching mask, the metallization can then be effected by filling the trenches for the interconnects and also the openings for the intermediate connections simultaneously with metal, metal also being deposited on the rest of the surface. Accordingly, the surface must also be planarized afterward, e.g. by means of a CMP (chemical mechanical polishing) process.

Furthermore, a method is known wherein the intermediate connections are patterned in a first process step (photolithography and etching process) and the interconnects are formed in a subsequent process step (photolithography and etching process) (sequential dual damascene). A photolithography method is used for this as standard, wherein method an intermediate layer made of a polymer, i.e. an ARC polymer as antireflection layer, is inserted below the photoresist layer in order to preclude reflections during the exposure of the photoresist and hence to minimize the reflected light and thereby to improve the resolution. This involves a standard photo-process for sub-0.5 mm technologies with DUV (deep ultraviolet) exposure. Antireflection layers of this type may comprise organic or inorganic materials.

However, in the process—which is effected after the photolithographic step for forming the etching mask—of etching for the purpose of opening the oxide layer in order to form e.g. a trench, this intermediate layer leads to problems. The ARC polymer layer is not opened during the photolithographic process. Therefore, the etching process for patterning the interconnects must begin with an ARC etching step (polymer etch). The second step is then the oxide etching step (normal two-step process). The problem here is that the contact holes that have already been opened are/have been filled with the ARC polymer.

In this case, fence formation is unavoidable. A fence is to be understood as a comparatively sharp-edged rim which projects as residue of the intermediate layer and at least partly surrounds the opening etched into the oxide layer. However, during a subsequent metallization step, such fences make it more difficult to fill the trench and enable mechanical stresses to proceed from the fences. In particular, such fences are a disturbance during Al deposition by sputtering.

It has previously been attempted to avoid fence formation through an increased addition of oxygen during the interconnect etching process, as a result of which the build-up of a protective sidewall polymer layer can be suppressed. On the other hand, at the same time the photoresist sidewall is no longer passivated to a sufficient extent as a result, with the consequence that the critical dimension is widened. Another solution approach would be to employ hard mask patterning, but this is impracticable owing to the increased process complexity.

SUMMARY OF THE INVENTION

It is accordingly an object of the invention to provide an etching process for a two-layer metallization, which overcomes the above-mentioned disadvantages of the heretofore-known devices and methods of this general type and which is simple and cost-effective to carry out and reliably prevents fences from being formed during the etching process and which equally satisfies the requirements made of a good ARC open process.

With the foregoing and other objects in view there is provided, in accordance with the invention, an etching method for a dual-layer metallization, that is in a dual damascene patterning process. The method comprises:

providing a semiconductor structure with functional elements formed in a substrate, a dielectric, such as an oxide disposed on the substrate, a photoresist etching mask above the dielectric, and a polymer intermediate layer between the etching mask and the dielectric layer;

etching the dielectric layer and the polymer intermediate layer for the dual damascene patterning with a $CF_4$ ARC open process with high selectivity with respect to the photoresist of the etching mask.

In accordance with an added feature of the invention, the etching time, depending on an etching depth, is set to approximately 140 s.

In accordance with an additional feature of the invention, the etching process is performed with an RF power of approximately 600 watts.

With the above and other objects in view there is also provided, in accordance with the invention, an etching process for oxide patterning in a semiconductor structure, which comprises:

providing a substrate with functional elements formed therein, an oxide layer on the substrate, an etching mask formed of a photoresist above the oxide layer, and a polymer intermediate layer forming an antireflection layer between the etching mask and the oxide layer;

patterning the oxide layer during a dual damascene patterning for a metallization;

etching the polymer intermediate layer and the oxide layer in a common $CF_4/CHF_3$ etching process with high selectivity with respect to the photoresist; and thereby adjusting an etching gas flow for $CF_4$ to 35–45 sccm (preferably approximately 40 sccm) and an etching gas flow for $CHF_3$ to 17–23 sccm (preferably approximately 20 sccm) in the common etching process.

In accordance with a further feature of the invention, oxygen gas and argon gas are added to the etching gases, and the gas flow of argon is set to 80–120 sccm and the gas flow of oxygen is set to 5–7 sccm.

In other words, the objects of the invention are achieved by virtue of the fact that the etching of the oxide layer and of the polymer intermediate layer for the dual damascene patterning is effected by means of a $CF_4$ ARC open process with high selectivity with respect to the photoresist with a lengthened etching time.

One advantage of this etching process according to the invention is to be seen in that the polymers in the via are etched at the same time as the oxide to trench depth, so that no fences can be formed. ARC open etching and oxide etching are effected in one step in order to pattern the interconnects in a manner free of fences. This makes it possible to perform the dual damascene patterning with a cost-effective etching process which is simple to implement in production, at the same time an etching profile being obtained which facilitates the use of cost-effective PVD metal filling methods.

Furthermore, the etching time is at least doubled compared with a conventional $O_2/N_2$ ARC open process, so that the polymers in the via can be reduced. The etching time is preferably approximately 140 seconds, depending on the other process parameters.

In accordance with a preferred embodiment, the entire etching process is effected in an etching chamber with plasma assistance, the RF power preferably being approximately 600 watts.

In accordance with a concomitant feature of the invention, the $CF_4$ ARC open/oxide process is assisted by a proportion of $CHF_3$, the $CF_4$ flow during the ARC open/oxide process being set to approximately 40 sccm and the $CHF_3$ flow being set to approximately 20 sccm.

Other features which are considered as characteristic for the invention are set forth in the appended claims.

Although the invention is illustrated and described herein as embodied in a etching process for a two-layer metallization, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
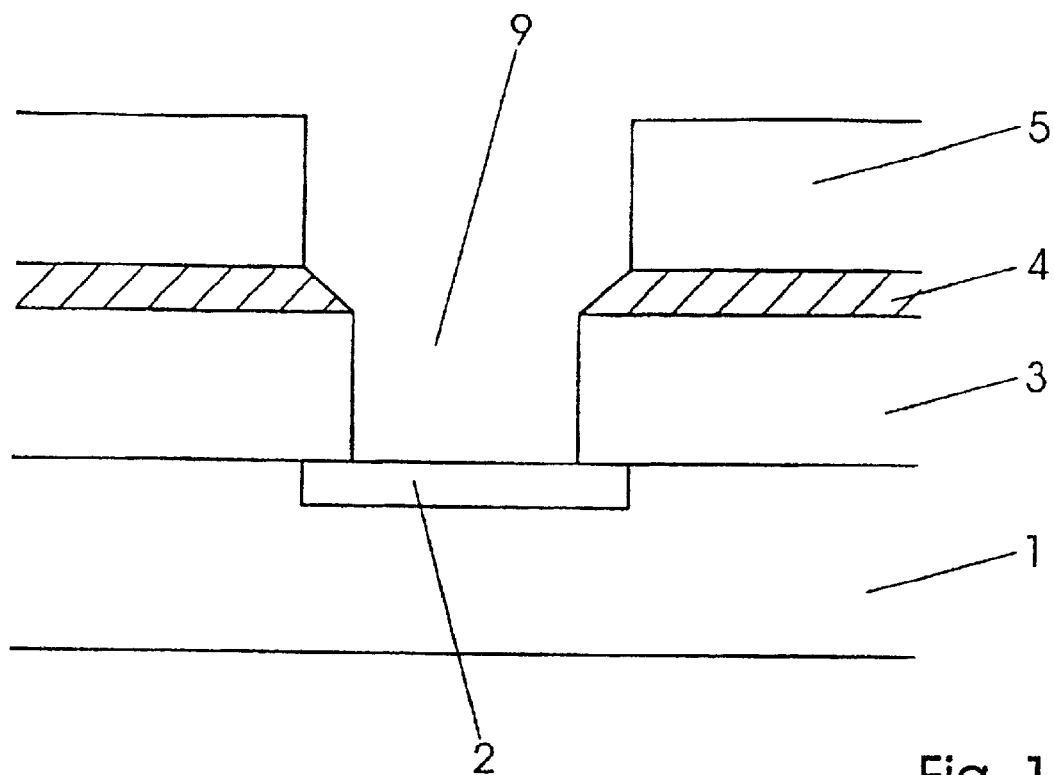
FIG. 1 is a diagrammatic detail from a semiconductor structure with a prepared etching mask and a polymer layer situated between an oxide layer and the etching mask.
Figure 2:
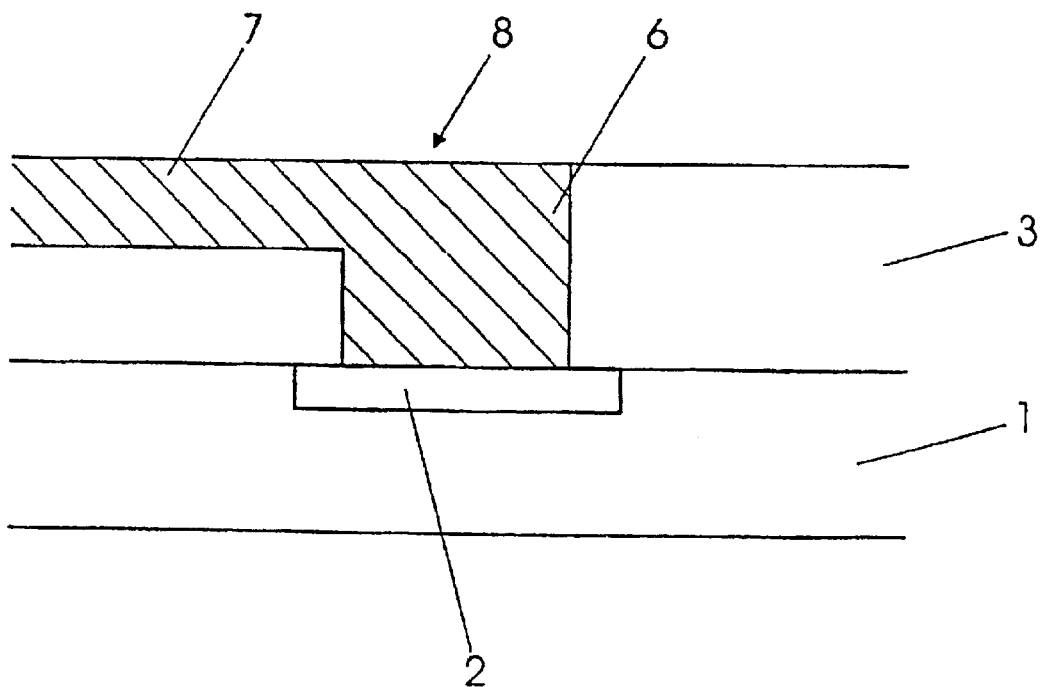
FIG. 2 is a detail of a semiconductor structure with a two-layer metallization, comprising an interconnect plane and an intermediate connection between the interconnect plane and the substrate of the semiconductor structure.

Referring now to the figures of the drawing in detail and first, particularly, to FIG. 1 thereof, there is shown a detail from a semiconductor structure with a substrate 1 made of silicon with a doped region 2 situated therein. The doped region 2 of the diagram represents a functional element of the semiconductor structure. Situated above the substrate 1 is an oxide layer 3, which is formed with an opening 9 for accommodating a metallization 8 and which, as intermediate connection 6, connects the doped region 2 to an interconnect plane 7 (FIG. 2).

The opening 9 is fabricated with the aid of the etching process described below. To that end, firstly a polymer intermediate layer 4 is applied on the oxide layer 3 and an etching mask 5, comprising a photoresist, is fabricated on the polymer intermediate layer 4 with a conventional photolithographic method. The polymer intermediate layer 4 is intended to prevent or reduce reflections during the exposure of the photoresist. During the subsequent etching-through of the oxide layer 3, it is necessary firstly to remove the polymer intermediate layer 4. That is done by the $CF_4$ ARC open process, which has a significantly higher selectivity with respect to the photoresist.

Furthermore, the etching time is at least doubled compared with a conventional $O_2/N_2$ ARC open process, so that oxide and polymers can be etched to trench depth.

The following parameters are particularly favorable for the $CF_4$ ARC open etching process in order to achieve a trench etching without the formation of fences:

| Parameter | Value | Unit |
| --- | --- | --- |
| Power | 550 ... 650 (600) | watts |
| Pressure | 80 ... 120 (100) | mTorr |
| He backside pressure | 26 | Torr |
| Magnetic field | 0 | Gauss |
| $CF_4$ flow | 35 ... 45 (40) | sccm /* |
| $CHF_3$ flow | 17 ... 23 (20) | sccm /* |
| $O_2$ | 5 ... 7 (6) | sccm /* |
| Ar | 80 ... 120 (100) | sccm /* |
| Etching time | 140 | seconds |

/* Gas flow

The values specified in parentheses are exemplary recommended values which are variable within the limits specified.

After running through the ARC open etching process with the specified parameters, it is then possible for the metallization to be effected by filling the opening 9 in the oxide by means of a PVD filling method as usual, the desired intermediate connection 6 between the doped region 2 and the interconnect plane 7 and the latter itself simultaneously being fabricated.

What is claimed is:

1. In a dual damascene patterning process, an etching method which comprises:
    providing a semiconductor structure with functional elements formed in a substrate, a dielectric disposed on the substrate, a photoresist etching mask above the dielectric, and a polymer intermediate layer between the etching mask and the dielectric layer;
    etching the dielectric layer and the polymer intermediate layer for the dual damascene patterning with a $CF_4$ ARC open process with high selectivity with respect to the photoresist of the etching mask, said $CF_4$ ARC open process including:
        adjusting RF power between 550 and 650 watts,
        adjusting pressure between 80 and 120 mtorr,
        adjusting $CF_4$ flow between 35 and 45 sccm,
        adjusting $CHF_3$ flow between 17 and 23 sccm,
        adjusting Ar flow between 80 and 120 sccm, and
        adjusting $O_2$ flow between 5 and 7 sccm.

2. The etching process according to claim 1, wherein the dielectric is an oxide layer.

3. The etching process according to claim 1, which comprises setting an etching time to at least twice an etching time of an $O_2/N_2$ ARC open process.

4. The etching process according to claim 3, which comprises setting the etching time, depending on an etching depth, to approximately 140 s.

5. The etching process according to claim 1, which comprises performing the etching process in an etching chamber with plasma assistance.

6. The etching process according to claim 5, which comprises etching with an RF power of approximately 600 watts.

7. The etching process according to claim 1, which comprises setting a $CF_4$ flow during the ARC open process to approximately 40 sccm and setting the $CHF_3$ flow to approximately 20 sccm.

8. An etching process for oxide patterning in a semiconductor structure, which comprises:
    providing a substrate with functional elements formed therein, an oxide layer on the substrate, an etching mask formed of a photoresist above the oxide layer, and a polymer intermediate layer forming an antireflection layer between the etching mask and the oxide layer;
    patterning the oxide layer during a dual damascene patterning for a metallization;
    etching the polymer intermediate layer and the oxide layer in a common $CF_4/CHF_3$ etching process with high selectivity with respect to the photoresist, the etching process including:
        adjusting RF power between 550 and 650 watts,
        adjusting pressure between 80 and 120 mtorr,
        adjusting $CF_4$ flow between 35 and 45 sccm,
        adjusting $CHF_3$ flow between 17 and 23 sccm,
        adjusting Ar flow between 80 and 120 sccm, and
        adjusting $O_2$ flow between 5 and 7 sccm.

9. The etching process according to claim 8, which comprises setting the etching time, depending on an etching depth, to approximately 140 s.

10. The etching process according to claim 8, which comprises performing the etching process in an etching chamber with plasma assistance.

11. The etching process according to claim 10, which comprises etching with an RF power of approximately 600 watts.

12. The etching process according to claim 8, which comprises setting the etching gas flow for $CF_4$ to approximately 40 sccm and the etching gas flow for $CHF_3$ to approximately 20 sccm in the common etching process.

* * * * *